(12) United States Patent
Burggraf

(10) Patent No.: US 10,943,810 B2
(45) Date of Patent: Mar. 9, 2021

(54) DEVICE AND METHOD FOR BONDING

(71) Applicant: EV GROUP E. THALLNER GMBH, St. Florian am Inn (AT)

(72) Inventor: Jurgen Burggraf, Scharding (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 725 days.

(21) Appl. No.: 14/443,792

(22) PCT Filed: Nov. 5, 2013

(86) PCT No.: PCT/EP2013/072995
§ 371 (c)(1),
(2) Date: May 19, 2015

(87) PCT Pub. No.: WO2014/079677
PCT Pub. Date: May 30, 2014

(65) Prior Publication Data
US 2015/0279715 A1    Oct. 1, 2015

(30) Foreign Application Priority Data
Nov. 21, 2012    (DE) .................. 10 2012 111 246.0

(51) Int. Cl.
*H01L 21/67*    (2006.01)
*H01L 21/687*    (2006.01)
(Continued)

(52) U.S. Cl.
CPC .... *H01L 21/6835* (2013.01); *H01L 21/67092* (2013.01); *H01L 24/83* (2013.01); *Y10T 156/1028* (2015.01)

(58) Field of Classification Search
CPC .................. H01L 21/6835; H01L 24/83; H01L 21/67092
See application file for complete search history.

(56) References Cited

U.S. PATENT DOCUMENTS 7,811,899 B2    10/2010    Yamamoto et al. .......... 438/455
8,434,538 B2    5/2013    Akiyama et al. ............. 156/382
(Continued)

FOREIGN PATENT DOCUMENTS

EP    0256150 A1    2/1988    ............. H01L 21/18
EP    0899778 A2    3/1999    ............. H01L 21/00
(Continued)

OTHER PUBLICATIONS

Machine Translation of Japanese Patent 05-082493, Date Unknown.*
(Continued)

*Primary Examiner* — Jeffry H Aftergut
(74) *Attorney, Agent, or Firm* — Kusner & Jaffe

(57) ABSTRACT

A device for bonding of a second substrate onto a first substrate, comprising a receiving apparatus for receiving the first substrate which has been coated with a bond layer and the second substrate which is held on the bond layer, and an action apparatus for applying a bond force to the second substrate on one action side of the second substrate, which side faces away from the bond layer proceeding from an initial zone A, which lies within an edge zone R of the action side as far as action on the entire action side.

Furthermore, this invention relates to a corresponding method.

18 Claims, 2 Drawing Sheets

(51) Int. Cl.
*H01L 21/683* (2006.01)
*H01L 23/00* (2006.01)

(56) References Cited

U.S. PATENT DOCUMENTS

| | | | | |
|---|---|---|---|---|
| 8,641,859 | B2 * | 2/2014 | Richter | B32B 37/1018 |
| | | | | 156/286 |
| 2002/0001920 | A1 * | 1/2002 | Takisawa | H01L 21/67092 |
| | | | | 438/455 |
| 2008/0138936 | A1 | 6/2008 | Yamamoto et al. | 438/118 |
| 2008/0153258 | A1 * | 6/2008 | Thallner | H01L 21/67092 |
| | | | | 438/455 |
| 2008/0210380 | A1 | 9/2008 | Mizuno | 156/379.7 |
| 2008/0279659 | A1 | 11/2008 | Kobayashi | 414/222.01 |
| 2010/0097738 | A1 * | 4/2010 | Kang | H01L 21/6831 |
| | | | | 361/234 |
| 2012/0103533 | A1 | 5/2012 | Akiyama et al. | 156/583.1 |
| 2012/0110825 | A1 | 5/2012 | Burggraf et al. | 29/468 |
| 2012/0152465 | A1 | 6/2012 | Lindner et al. | 156/701 |
| 2012/0186741 | A1 | 7/2012 | Lake | 156/306.3 |

FOREIGN PATENT DOCUMENTS

| | | | | |
|---|---|---|---|---|
| JP | 04-065109 A | * | 3/1992 | |
| JP | H05 29183 A | | 2/1993 | H01L 21/02 |
| JP | 05-082493 A | * | 4/1993 | |
| JP | 05082493 A | | 4/1993 | H01L 21/304 |
| JP | H05 116049 A | | 5/1993 | B23Q 3/08 |
| JP | H09 320913 A | | 12/1997 | H01L 21/02 |
| JP | 11-277422 A | * | 10/1999 | |
| JP | 2004-241568 A | | 8/2004 | H01L 21/304 |
| JP | 2008-147249 A | | 6/2008 | H01L 21/02 |
| JP | 2008-182016 A | | 8/2008 | H01L 21/02 |
| JP | 2012-099531 A | | 5/2012 | H01L 21/02 |

OTHER PUBLICATIONS

Machine Translation of Japanese Patent 04-065109, Date Unknown.*
Machine Translation of Japanese Patent 11-277422, Date Unknown.*
Office Action issued in corresponding Japanese Patent Application No. 2015-543367 dated Jul. 4, 2016.
International Search Report issued in corresponding International Patent Application No. PCT/EP2013/072995, dated Dec. 17, 2013.

* cited by examiner

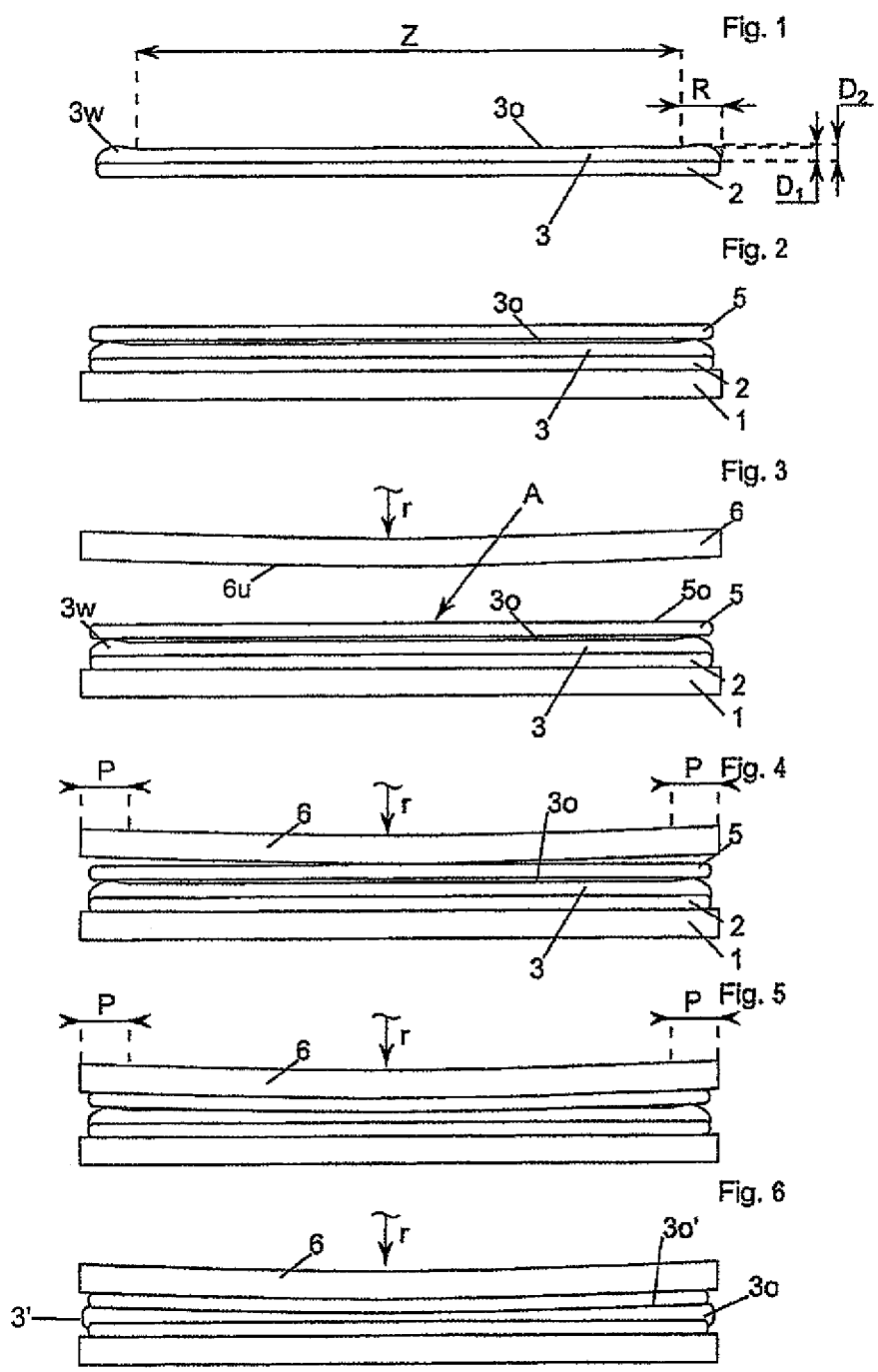

DEVICE AND METHOD FOR BONDING

RELATED APPLICATIONS

This application is a National Stage of International Application No. PCT/EP2013/072995 filed Nov. 5, 2013, which claims the benefit of German Patent Application No. 102012111246.0, filed Nov. 21, 2012.

FIELD OF THE INVENTION

The invention relates to a device for bonding a second substrate onto a first substrate and a corresponding method.

BACKGROUND OF THE INVENTION

In the semiconductor industry, product wafers are often temporarily cemented to carrier wafers. The cement, a so-called "bonding adhesive," is applied to the product wafer and/or the carrier wafer in the form of a layer with a thickness which is as uniform as possible. After the coating process, the two wafers must however be pressed onto one another with high forces. This process is known under the term "bonding." The pressure discs that are used to apply pressure to the two wafers should be flat according to the prior art, in order to apply a bond force which is as uniform as possible overall. Accordingly, the pressure discs are produced to exacting standards. The lower disc is produced as a resting part of a bond chuck, therefore a sample carrier. The upper disc is called the pressure disc and is accordingly mounted on the top of a bond chamber.

After a product and/or a carrier wafer has been lacquered with a spin lacquering method, generally a so-called "edge bead" is established on the layer edge based on rheological and fluid-dynamic properties. This "edge bead" is an accumulation of material which can be found on a round substrate, a wafer, along the entire edge. The difference between the material thickness in the center and the material thickness on the edge is only a few microns, often even only a few nanometers. In bonding, therefore in the application of the bond force, very often the problem of a nonuniform bond force and/or of the forcing-out of the protruding or excess cement arises therefrom.

In the ideal case, one layer has a homogeneous thickness for the bonding process. In this respect, homogenous thickness means that the thickness of the bonding layer is the same at any position or is within an acceptable tolerance. But experience shows that even under ideal bonding conditions, i.e., in the case of a homogeneous layer thickness, a perfectly evenly machined pressure disc, a perfectly evenly machined bond chuck, and uniform, homogenous pressure application, there can be a layer with an inhomogeneous thickness after the bonding process. The reason for this is the rheological and fluid-dynamic properties of the layer and the prevailing initial and boundary conditions of the physical problem. Since the material cannot spread equally quickly in the plane in the center, like the material on the edge of the substrate, an increased flow velocity occurs in the vicinity of the edge. It could be said that the material in the center itself is obstructed while, conversely the edge material can drain freely to the outside. For a layer with a corresponding "edge bead" the situation would deteriorate accordingly, since in this case even more material is present on the edge than in the center per unit of area.

An advantage of this invention is devices and methods for bonding such that the indicated problems of the inhomogeneous layer thickness can be prevented or at least reduced.

This advantage is achieved with the features of claims 1 and 10. Advantageous developments of the invention are given in the dependent claims. All combinations of at least two of the features given in the specification, the claims and/or the drawings also fall within the scope of the invention. For value ranges, values within the indicated limits will also be considered to be disclosed as boundary values and will be claimed in any combination.

Hereinafter, it is distinguished between a product substrate and a substrate to illustrate the version as claimed in the invention. The product substrate and substrate can be optionally interchanged and/or combined so that for example also substrate-substrate, product substrate-product substrate, substrate-product substrate or product substrate-substrate combinations are conceivable. Furthermore, lacquering of the carrier substrate is also conceivable. A first substrate can be the substrate, for example a carrier substrate. A second substrate can be the product substrate.

SUMMARY OF THE INVENTION

According to the present invention, a bond force is applied to the product substrate on one action side of the product substrate facing away from the bond layer proceeding from an initial zone A which lies within an edge zone R of the action side. In other words: first of all the product substrate, dictated by the shape of one pressure transfer side of the action apparatus, is pressed within the initial zone onto the bond layer (the product substrate in the region of the edge zone can rest at least partially on a bead which has formed by applying the bond layer—the so-called "edge bead"—of the bond layer to the extent this bead is present).

One inventive idea is to initiate the pressure application in the center of the bond layer where the material of the bond layer toward the side is completely surrounded by the further material of the bond layer so that the material in the center is subject to flow obstruction due to the prevailing edge conditions. This yields one optimum possibility for joining the two wafers to one another since a so-called "squeeze out", therefore (uncontrolled and excess) forcing-out of the bond material is hindered or is at least reduced. For an existing "edge bead," the product wafer which has been deposited on the bond layer is bent by the action apparatus toward the center of the bond layer and thus due to its elastic deformation prevents the premature transfer of force from the action apparatus to the "edge bead".

One aspect of this invention is to provide an engineering design for a pressure disc with which it is possible to concentrate and initiate the application of force in the center in which the material is located which flows poorly due to edge conditions.

According to one advantageous embodiment of this invention, the action apparatus is equipped with a pressure disc with a convexly curved pressure transfer side. Uniform application of pressure is possible with one pressure transfer side which is closed over the entire surface. The pressure disc is made nonadhering on its pressure transfer side.

Here it is especially advantageous if the tangential plane of the pressure transfer side which is curved is spaced in the direction of the normal to an imaginary plane of an ideally planar pressure transfer side at least by 5 nm and/or a maximum 500 μm, especially at least by 20 nm and/or a maximum 200 μm, preferably at least by 50 nm and/or at maximum 50 μm, more preferably at least 100 nm and/or a maximum 5 μm. It is advantageous if the curvature is made concentric. In this way, the pressure disc can be made on the one hand rigid and unyielding for the bond force used, due to the very small curvature with a very large radius of curvature there being only a minimum bulge by which on the one hand a leveling or planarization of the bond layer takes place from the inside to the outside and on the other hand a corresponding concave, slight curvature also arises in the bond layer.

A bond result as uniform as possible can be achieved by the initial zone A being arranged concentrically to the product substrate side.

In a preferred embodiment, the action apparatus has a punch which applies the bond force and the punch controlled by a control apparatus. The punch is connected preferably interchangeably to the pressure disc, so that different pressure discs can be used for the respective requirements. Advantageously, the formation of the bond layer is measured on the edge zone R in order to choose a suitable pressure disc.

According to another advantageous embodiment of the invention, the pressure disc is formed from a lower disc which encompasses the pressure transfer side and from a retaining disc which fixes the lower disc in the region of one periphery P via fixing means. In this way, the pressure disc can be produced with the above described properties, i.e., an only slight curvature, in a simple and exact manner.

It is especially advantageous if the lower disc in the region of the initial zone A is made thicker than on the periphery P.

Alternatively, between the lower disc and the retaining disc in the region of the initial zone A, a spacer element is provided so that the lower disc can also have two parallel flat sides and thus can be more easily produced. The lower disc is more elastic than the upper retaining disc which is made rigid.

In another alternative configuration, for setting the curvature of the pressure transfer side, a curvature element is provided which acts on the lower disc opposite the retaining disc in the region of the initial zone A and which is controlled by the control apparatus. In this way, not only can the curvature be set one time, but even active control of the curvature can take place during the approach and during the bonding.

Here, the radius of curvature of the pressure disc is set or a pressure disc with a certain radius of curvature which is suitable for the wafer is selected.

The described features apply analogously to the device and the method as well as use of the device.

The pressure disc can be produced from any material. But it has been shown that materials with high E moduli and high hardness values show especially good bond results. The following materials are preferably used for the pressure disc
- ceramics, especially silicon nitride ($Si_3N_4$), silicon carbide (SiC) and/or boron nitride (BN) and/or
- metals and their alloys in general, refractory materials, especially steels and/or iron-based materials and/or
- graphite and/or
- glass and/or
- polymers and/or
- composite materials.

Other advantages, features and details of the invention will become apparent from the description of preferred exemplary embodiments and using the drawings.

BRIEF DESCRIPTION OF THE DRAWINGS

FIG. 1 shows a cross sectional view of a first step of one embodiment of the method as claimed in the invention, FIG. 2 shows a cross sectional view of a second step of one embodiment of the method as claimed in the invention, FIG. 3 shows a cross sectional view of a third step of one embodiment of the method as claimed in the invention, FIG. 4 shows a cross sectional view of one embodiment of the method as claimed in the invention at the start of bonding, FIG. 5 shows a cross sectional view of one embodiment of the method as claimed in the invention during bonding, FIG. 6 shows a cross sectional view of one embodiment of the method as claimed in the invention at the end of bonding.

DETAILED DESCRIPTION OF THE PREFERRED EMBODIMENTS

Figure 7:
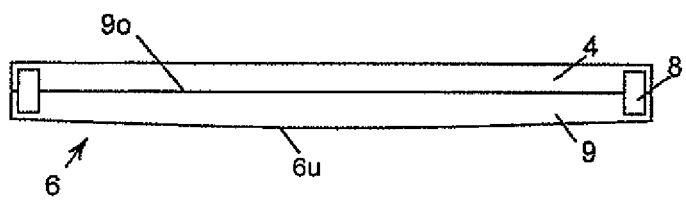
FIG. 7 shows a cross sectional view of a first embodiment of a pressure disc as claimed in the invention.

The same components or components with the same action are identified with the same reference numbers in the figures.

A process according to the invention is described below. The process uses a pressure disc in order to carry out a controlled bond process. In the drawings, the process as claimed is shown on a bond layer with an "edge bead". According to the invention, the process as can also be carried out on a bond layer with a homogeneous layer thickness, i.e., without an "edge bead". The control takes place via software-supported control apparatus which is not shown.

In a first step (FIG. 1), a coating material (temporary cement) is applied as a bond layer 3 to one substrate 2 (a wafer). The coating takes place in a coating unit which is conventional in the industry. In the production of the bond layer 3 by a spin-coating process, a peripheral bead 3w often arises in an edge zone R and is characterized by a thickness $D_2$ which is increased in contrast to the average layer thickness $D_1$.

In a second process step, the wafer 2 which has been lacquered with the bond layer 3 is transported into a bonding unit (chamber) and is deposited on a receiving apparatus 1, namely, a sample holder (bond chuck). The product substrate 5 (second wafer) which is to be bonded to the substrate 2 is brought into contact with the bond layer 3 (FIG. 2). In a bond chamber (which is not shown), spacers (not shown), so-called "flags", are used in order to keep the product substrate 5 separated from the surface 3o of the layer 3 until a complete evacuation of the bond space has taken place by a vacuum unit (not shown) which is connected to the bond chamber.

Figure 8:
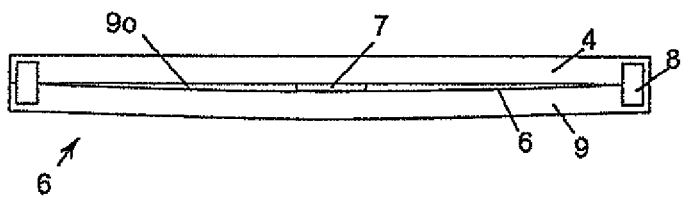
FIG. 8 shows a cross sectional view of a second embodiment of a pressure disc as claimed in the invention.
Figure 9:
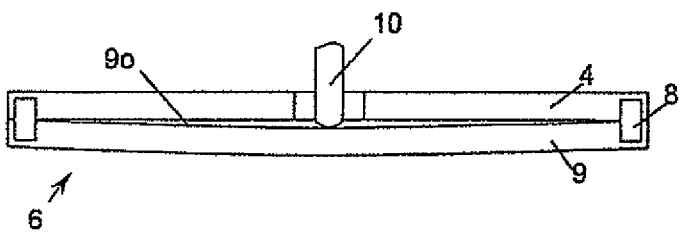
FIG. 9 shows a cross sectional view of a third embodiment of a pressure disc as claimed in the invention.

In another step, the closing of the bond chamber takes place. In this way a pressure disc 6 which is attached to the cover of the bond chamber is positioned over the product substrate 5. The pressure disc 6 has a convex curvature with a radius of curvature r which faces the product substrate 5. Several embodiments for the pressure disc 6 are shown in FIGS. 7 to 9.

In a fourth process step, illustrated in FIG. 4, the product substrate 5 is touched by the convex pressure disc 6 first in a point-like initial zone A, preferably exactly in the center of the product substrate 5, and as a result, a bond force is applied to it. Due to the convex shape of the pressure disc 6, in this process step the edge zone R of the layer 3 is not exposed to any noteworthy pressure (in any case above, a negligible stress and weight of the product substrate 5). The application of pressure to the center of the wafer 5, in the presence of an edge bead, leads first only to a bowing of the product substrate 5 in the direction of the bond layer 3.

By a continuous relative movement of the pressure disc 6, especially normally, toward the receiving apparatus 1, the center of the product substrate 5 is guided nearer and nearer to the surface 3o of the bond layer 3, without a noteworthy increase of the pressure stress on the edge zone R. Only with the contact of the convexly curved pressure disc 6 with a periphery P of the product substrate 5 does a transfer of pressure with a bond force to the edge zone R of the bond layer 3 take place.

This is especially the case when the tangential plane of the pressure transfer side 6u is spaced in the direction of the normal to the tangential plane at least by 5 nm and/or a maximum 500 μm, especially at least by 20 nm and/or a maximum 200 μm, preferably at least 50 nm and/or at maximum by 50 μm, more preferably at least 100 nm and/or a maximum 5 μm. Preferably, the pressure disc 6, after determining the height of the bead 3w, is set or selected such that the distance of the tangential plane to the pressure transfer side 6u on one peripheral edge of the pressure disc 6 corresponds to the average height $(H=D_2-D_1)$ of the bead.

In the case of the absence of an "edge bead," the product wafer 5 rests flat on the bond layer 3 and the initiation and transfer of the force from the pressure disc 6 to the product wafer 5 take place without prior bowing of the product wafer 5.

By further raising the pressure, a larger and larger part of the pressure disc 6 makes contact with the product substrate 5 and thus with advancing approach distributes the force over the entire action side 5o.

In both cases, the material in the center is more strongly hindered from flowing than the material on the edge. The reduced flow capacity of the material in the center is explained by its flow capacity in the radial direction being hindered by material lying farther outside its flow and in the perpendicular direction being hindered by the pressure disc. In other words: Since the action side 5o is exposed to corresponding force first in the center, a force is transferred which however leads to an inconsiderable flow of the material in the center. The edge at this instant is not at all included in the flow since the corresponding force has not yet been distributed over the entire action side 5o.

Due to the process flow, an almost completely leveled surface 3o′ is formed which no longer has a bead 3w, but at the same time does not have any prematurely and uncontrollably displaced material on the edge. The concave negative of the layer 3′ which has been produced by the convex pressure disc 6 has a deviation of planarity which is small, if not even negligibly small, compared to the untreated bond layer 3. This deviation from planarity is negligible due to the very large radius of curvature r of the pressure disc 6 and for further processing it is essentially irrelevant, especially since the advantage of the leveling of the bond layer 3 as claimed in the invention predominates.

Furthermore, the following embodiments of the pressure disc 6 according to FIGS. 7 to 9 are disclosed.

The configuration of the pressure disc 6 of several components is common to all three embodiments, specifically:
- a lower disc 9 which has the pressure transfer side 6u, and
- a retaining disc 4 for holding/fixing of the lower disc 9 via fixing means 8, which have been localized in the region of the periphery P.

In a first embodiment, the pressure disc 6 is already convexly shaped and is connected to a retaining element 4 via the fixing means 8 on its top 9o.

In a second embodiment, a planar lower disc 9, which is connected by the fixing means 8 on its top 9o to the retaining disc 4, is brought by a spacer element 7 into a correspondingly convex shape by the lower disc 9 being made more flexible than the especially rigid retaining disc 4. The spacer element 7 is preferably round. It has a thickness of less than 5 mm, preferably less than 1 mm, more preferably less than 100 μm, still more preferably less than 1 μm, most preferably less than 100 nm.

In a third embodiment, a curvature element 10 is used to apply pressure to the center of the lower disc 9 which is connected via fixing means 8 on its top 9o to the retaining element 4. By applying pressure to the center of the pressure disc 6 with a curvature pressure, the convex curvature of the pressure disc 6 can be continuously changed or set one time. Preferably, the elasticity of the pressure disc 6 is so great that when the center of the pressure disc 6 is relieved by removing the curvature element 10, the pressure disc 6 is automatically deformed back into a planar initial position. As claimed in the invention, a corresponding embodiment is contemplated in which the curvature element 10 is connected to the lower disc 9 and allows a corresponding active control of the radius of curvature of the pressure disc 6.

REFERENCE NUMBER LIST 1 receiving apparatus
2 substrate
3 bond layer
3o, 3o′ surface
3w bead
4 retaining disc
5 product substrate
5o action side
6 pressure disc
6u pressure transfer side
6o top
7 spacer element
8 fixing means
9 lower disc
10 curvature element
A initial zone
$D_1$, $D_2$ thickness
R edge zone
P periphery
r radius of curvature
H height
Z center Having described the invention, the following is claimed:

1. A device for bonding of a second substrate onto a first substrate, the device comprising:
    a receiving apparatus for receiving the first substrate, which has been coated with a bond layer, and the second substrate, which is held on the bond layer,
    an action apparatus for applying a bond force to the second substrate on one action side of the second substrate that faces away from the bond layer proceeding from an initial zone A, which lies within an edge zone R of the action side as far as action on the entire action side, the action apparatus comprising a pressure disc of high E moduli material, the pressure disc comprising a lower disc and a retaining disc, the lower disc encompassing a pressure transfer side of the pressure disc, the retaining disc being configured to fix the lower disc in a region of one periphery P of the pressure disc,
    wherein the material of the pressure disc is ceramic.

2. The device as claimed in claim 1, wherein the pressure transfer side of the pressure disc is convexly curved.

3. The device as claimed in claim 2, wherein the tangential plane of the pressure transfer side is spaced in the direction of the normal to the tangential plane in a range of 5 nm to 500 µm.

4. The device as claimed in claim 1, wherein the initial zone A is arranged concentrically to the action side.

5. The device as claimed in claim 1, wherein the action apparatus has a punch which applies the bond force controlled by a control apparatus.

6. The device as claimed in claim 5, wherein for setting a curvature of the pressure transfer side there is a curvature element which acts on the lower disc opposite the retaining disc in the region of the initial zone A and is controlled by the control apparatus.

7. The device as claimed in claim 1, wherein the lower disc in the region of the initial zone A is made thicker than on the periphery P.

8. The device as claimed in claim 1, wherein between the lower disc and the retaining disc in the region of the initial zone A there is a spacer element.

9. The device as claimed in claim 1, wherein the ceramic material is at least one of the group consisting of silicon nitride, silicon carbide, and boron nitride.

10. A method for bonding of a second substrate onto a first substrate, the method comprising:
receiving, with a receiving apparatus, the first substrate, which has been coated with a bond layer, and the second substrate, which is held on the bond layer, and
applying, with an action apparatus, a bond force to the second substrate on one action side of the second substrate that faces away from the bond layer proceeding from an initial zone A, which lies within an edge zone R of the action side as far as action on the entire action side, the action apparatus comprising a pressure disc of high E moduli material, the pressure disc comprising a lower disc and a retaining disc, the lower disc encompassing a pressure transfer side of the pressure disc, the retaining disc being configured to fix the lower disc in a region of one periphery P of the pressure disc,
wherein the material of the pressure disc is ceramic.

11. A device for bonding of a second substrate onto a first substrate, comprising:
a receiving apparatus for receiving a first substrate which has been coated with a bond layer and which has a second substrate held on the bond layer, and
an action apparatus for applying a bond force to the second substrate on one side thereof, said side facing away from the bond layer, proceeding from an initial zone A which lies within an edge zone R of the action side as far as action on the entire action side,
wherein the material of the pressure disc is ceramic,
wherein the action apparatus is configured to bend the second substrate, which is deposited on the bond layer, towards a center of the bond layer, and
wherein the action apparatus comprises a pressure disc of high E moduli material with a convexly curved pressure transfer side, the pressure disc being formed from a lower disc which encompasses the pressure transfer side and a retaining disc that is configured to fix the lower disc in a region of one periphery P of the pressure disc.

12. The device as claimed in claim 11, wherein a tangential plane of the pressure transfer side of the lower disc is spaced in the direction of the normal to an imaginary plane of an ideally planar pressure transfer side at least by 5 nm.

13. The device as claimed in claim 11, wherein the initial zone A is arranged concentrically to the action side of said second substrate.

14. The device as claimed in claim 11, wherein the action apparatus has a punch which applies the bond force that is controlled by a control apparatus.

15. The device as claimed in claim 11, wherein the lower disc in the region of the initial zone A is made thicker than on the periphery P thereof.

16. The device as claimed in claim 11, wherein a spacer element is disposed between the lower disc and the retaining disc in the region of the initial zone A.

17. The device as claimed in claim 11, wherein for setting a curvature of the pressure transfer side, a curvature element acts on the lower disc opposite the retaining disc in the region of the initial zone A.

18. A device for bonding of a second substrate to a first substrate having a first surface that is coated with a bond layer, comprising:
a receiving apparatus upon which the first substrate is supported with the bond layer being in contact with the second substrate, said second substrate having an action side facing away from said bond layer, said action side having an edge zone R defined along a periphery of said second substrate and an initial zone A which lies within said edge zone R;
a pressure disc of high E moduli material, the pressure disc being configured to apply a bond force to said action side of said second substrate from the initial zone A of the action side to the edge zone R of the action side as far as action on an entirety of the action side, said pressure disc comprised of:
a retaining disc, and
a lower disc mounted to said retaining disc, said lower disc encompassing a pressure transfer side of the pressure disc, the retaining disc being configured to fix the lower disc in a region of one periphery P of the pressure disc, said pressure transfer side being convexly curved; and
means for moving said pressure disc toward said second substrate,
wherein said convexly curved pressure transfer side of said lower disc initially engages said action side of said second substrate in the initial zone A and applies the bond force to said second substrate that proceeds from the initial zone A to said edge zone R as said pressure disc moves toward said receiving apparatus, and
wherein the material of the pressure disc is ceramic.

* * * * *